United States Patent
Cohen et al.

(10) Patent No.: US 9,337,865 B2
(45) Date of Patent: May 10, 2016

(54) LOG-LIKELIHOOD RATIO (LLR) DAMPENING IN LOW-DENSITY PARITY-CHECK (LDPC) DECODERS

(71) Applicant: Seagate Technology LLC, Cupertino, CA (US)

(72) Inventors: Earl T. Cohen, Oakland, CA (US); Erich F. Haratsch, San Jose, CA (US); Abdel-Hakim S. Alhussien, Milpitas, CA (US)

(73) Assignee: Seagate Technology LLC, Cupertino, CA (US)

( * ) Notice: Subject to any disclaimer, the term of this patent is extended or adjusted under 35 U.S.C. 154(b) by 372 days.

(21) Appl. No.: 13/934,999

(22) Filed: Jul. 3, 2013

(65) Prior Publication Data

US 2014/0143637 A1 May 22, 2014

Related U.S. Application Data

(60) Provisional application No. 61/729,178, filed on Nov. 21, 2012.

(51) Int. Cl.
  *H03M 13/00* (2006.01)
  *H03M 13/11* (2006.01)
  *H03M 13/37* (2006.01)
  *G06F 11/10* (2006.01)

(52) U.S. Cl.
  CPC ....... *H03M 13/1108* (2013.01); *G06F 11/1012* (2013.01); *H03M 13/1111* (2013.01); *H03M 13/3707* (2013.01); *H03M 13/618* (2013.01); *H03M 13/658* (2013.01); *G06F 11/108* (2013.01)

(58) Field of Classification Search
  CPC ..... H04L 1/0009; H04L 1/0057; H04L 13/35; H04L 1/0041; H04L 1/0071
  USPC ........................................................ 714/774
  See application file for complete search history.

(56) References Cited

U.S. PATENT DOCUMENTS

| | | | |
|---|---|---|---|
| 6,574,716 B2 | 6/2003 | Dovi | |
| 6,898,670 B2 | 5/2005 | Nahum | |
| 7,099,190 B2 | 8/2006 | Noguchi et al. | |
| 7,430,693 B2 | 9/2008 | Noguchi et al. | |

(Continued)

OTHER PUBLICATIONS

X. Zhang, F. Cai, C. Shi, "Low-Power LDPC Decoding Based on Iteration Prediction," 2012 IEEE International Symposium on Circuits and Systems (ISCAS), pp. 3041-3044, May 2012 (USA).

*Primary Examiner* — Esaw Abraham
*Assistant Examiner* — Enam Ahmed
(74) *Attorney, Agent, or Firm* — IP Legal Services, LLC (57) ABSTRACT

Described embodiments provide a media controller to read data stored in a media. The media controller determines a value for each bit of a shortened codeword from the media. The shortened codeword includes a plurality of non-shortened bits of a full codeword, where the full codeword includes the plurality of non-shortened bits and one or more shortened bits. Shortened bits correspond to bits unused in the shortened codeword. The media controller converts the determined values for each bit of the shortened codeword into a first set of log-likelihood ratio (LLR) values. The full codeword is decoded using the first set of LLR values for the shortened codeword. The media controller dampens one or more LLR values corresponding to non-shortened bits of the codeword to produce a second set of LLR values and decodes the second set of LLR values.

18 Claims, 8 Drawing Sheets

(56) References Cited

U.S. PATENT DOCUMENTS

| | | |
|---|---|---|
| 7,453,728 B2 | 11/2008 | Noguchi et al. |
| 7,574,443 B2 | 8/2009 | Bahar et al. |
| 7,607,065 B2 | 10/2009 | Bickerstaff et al. |
| 7,818,525 B1 | 10/2010 | Frost et al. |
| 7,844,691 B2 | 11/2010 | Gopalakrishnan |
| 8,019,849 B1 | 9/2011 | Lopilato et al. |
| 8,060,797 B2 | 11/2011 | Hida et al. |
| 8,082,466 B2 | 12/2011 | Tanaka et al. |
| 8,171,125 B2 | 5/2012 | Gopalakrishnan |
| 8,171,380 B2 | 5/2012 | Yang et al. |
| 8,189,379 B2 | 5/2012 | Camp et al. |
| 8,190,842 B2 | 5/2012 | Frost et al. |
| 8,219,861 B2 | 7/2012 | Hida et al. |
| 8,281,220 B2 | 10/2012 | Kitahara |
| 8,341,487 B2 | 12/2012 | Blanksby et al. |
| 8,996,957 B1 * | 3/2015 | Northcott ............ G06F 11/1012 714/763 |
| 2004/0098659 A1 * | 5/2004 | Bjerke ................. H03M 13/11 714/776 |
| 2006/0192691 A1 * | 8/2006 | Kan ................. H03M 13/1191 341/50 |
| 2009/0216936 A1 | 8/2009 | Chu et al. |
| 2010/0180183 A1 | 7/2010 | Hung et al. |
| 2010/0246244 A1 | 9/2010 | Shimomura et al. |
| 2011/0225346 A1 | 9/2011 | Goss et al. |
| 2012/0185744 A1 | 7/2012 | Varnica et al. |
| 2012/0226835 A1 | 9/2012 | Thomas |
| 2012/0239972 A1 | 9/2012 | Shibata et al. |
| 2012/0246525 A1 | 9/2012 | Shibata et al. |
| 2012/0260148 A1 | 10/2012 | Hughes et al. |
| 2012/0278450 A1 | 11/2012 | Soltis |

* cited by examiner

LOG-LIKELIHOOD RATIO (LLR) DAMPENING IN LOW-DENSITY PARITY-CHECK (LDPC) DECODERS

CROSS-REFERENCE TO RELATED APPLICATIONS

This application claims the benefit of the filing date of U.S. provisional patent application No. 61/729,178 filed Nov. 21, 2012, the teachings of which are incorporated herein in their entireties by reference.

The subject matter of this application is related to U.S. patent application Ser. No. 13/464,433 filed May 4, 2012 and Ser. No. 13/567,025 filed Aug. 4, 2012, the teachings of which are incorporated herein in their entireties by reference.

BACKGROUND

Flash memory is a non-volatile memory (NVM) that is a specific type of electrically erasable programmable read-only memory (EEPROM). One commonly employed type of flash memory technology is NAND flash memory. NAND flash memory requires small chip area per cell and is typically divided into one or more banks or planes. Each bank is divided into blocks; each block is divided into pages. Each page includes a number of bytes for storing user data, error correction code (ECC) information, or both.

There are three basic operations for NAND devices: read, write and erase. The read and write operations are performed on a page-by-page basis. Page sizes are generally $2^N$ bytes of user data (plus additional bytes for ECC information), where N is an integer, with typical user data page sizes of, for example, 2,048 bytes (2 KB), 4,096 bytes (4 KB), 8,192 bytes (8 KB) or more per page. A "read unit" is the smallest amount of data and corresponding ECC information that can be read from the NVM and corrected by the ECC, and might typically be between 4K bits and 32K bits (e.g., there is generally an integer number of read units per page). Pages are typically arranged in blocks, and an erase operation is performed on a block-by-block basis. Typical block sizes are, for example, 64, 128 or more pages per block. Pages must be written sequentially, usually from a low address to a high address within a block. Lower addresses cannot be rewritten until the block is erased. Associated with each page is a spare area (typically 100-640 bytes) generally used for storage of ECC information and/or other metadata used for memory management. The ECC information is generally employed to detect and correct errors in the user data stored in the page, and the metadata might be used for mapping logical addresses to and from physical addresses. In NAND flash chips with multiple banks, multi-bank operations might be supported that allow pages from each bank to be accessed substantially in parallel.

NAND flash memory stores information in an array of memory cells made from floating gate transistors. These transistors hold their voltage level, also referred to as charge, for long periods of time, on the order of months or years, without external power being supplied. In single-level cell (SLC) flash memory, each cell stores one bit of information. In multi-level cell (MLC) flash memory, each cell can store more than one bit per cell by choosing between multiple levels of electrical charge to apply to the floating gates of its cells. MLC NAND flash memory employs multiple voltage levels per cell with a serially linked transistor arrangement to allow more bits to be stored using the same number of transistors. Thus, considered individually, each cell has a particular stored (programmed) charge that corresponds to the logical bit value(s) being stored in the cell, and the cells are read based on one or more threshold voltages for each cell.

While, ideally, all cells in the NVM would have the same threshold voltages, in practice the threshold voltages differ across the cells in "threshold voltage distributions" that are similar in shape to a Gaussian probability curve. Considered across a large number of cells (e.g., a read unit or a page), there are as many threshold voltage distributions (e.g., Gaussian probability curves) as there are states per cell (e.g., $2^b$ distributions per cell, where b is the number of bits). Thus, for SLC flash memories, there are two states (0 or 1) and thus two threshold voltage distributions (one for zeroes and another for ones) per cell, and a single read threshold voltage. Most MLC NAND flash memories employs four possible states per cell, and can thus store two bits of information per cell. Thus, for MLC flash memories, there are four states (e.g., 00, 01, 10, 11) and thus four threshold voltage distributions and three read thresholds.

Increasing the number of bits per cell causes cell-to-cell interference and retention noise (e.g., a drift in the stored charge, such as due to leakage) to become more severe, which reduces the amount of voltage margin separating each voltage level and increases the likelihood of read errors and, thus, the bit error ratio (BER) of the system. Further, the threshold voltage distributions of each cell can change over operating time of the NVM, for example due to read disturb, write disturb, retention loss, cell aging and process, voltage and temperature (PVT) variations, also increasing the BER. When a bit error is encountered in a read unit read from NVM, the system (e.g., a controller coupled to the NVM) might re-read the read unit at different voltage values of the read threshold to attempt to locate a sample of the read unit that is hard-decoding correctable. Further, software complexity might be increased to compensate for a larger BER, for example by employing an error correction code (ECC) such as Bose-Chaudhuri-Hocquenghem (BCH) and Low-Density Parity-Check (LDPC).

As memory devices become smaller and the number of levels per cell increases, more powerful ECC is required. For example, ECC is improved by decreasing the code rate for BCH codes, however, decreasing the code rate reduces the storage capacity of the NVM. Unlike BCH codes, LDPC codes allow soft-decision decoding, where in addition to estimating each bit value ("hard decoding"), the decoder also estimates each bit's reliability ("soft-decision decoding") For LDPC codes to outperform BCH codes, improved estimation of each bit's reliability is desired.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Described embodiments provide a media controller to read data stored in a media. The media controller determines a value for each bit of a shortened codeword from the media. The shortened codeword includes a plurality of non-shortened bits of a full codeword, where the full codeword includes the plurality of non-shortened bits and one or more shortened bits. Shortened bits correspond to bits unused in the shortened codeword. The media controller converts the determined values for each bit of the shortened codeword into a first set of log-likelihood ratio (LLR) values. The full codeword is decoded using the first set of LLR values for the shortened codeword. The media controller dampens one or more LLR values corresponding to non-shortened bits of the codeword to produce a second set of LLR values and decodes the second set of LLR values.

BRIEF DESCRIPTION OF THE DRAWING FIGURES

Other aspects, features, and advantages of described embodiments will become more fully apparent from the following detailed description, the appended claims, and the accompanying drawings in which like reference numerals identify similar or identical elements.

DETAILED DESCRIPTION

Described embodiments provide a media controller to read data stored in a media. The media controller determines a value for each bit of a shortened codeword from the media. The shortened codeword includes a plurality of non-shortened bits of a full codeword, where the full codeword includes the plurality of non-shortened bits and one or more shortened bits. Shortened bits correspond to bits unused in the shortened codeword. The media controller converts the determined values for each bit of the shortened codeword into a first set of log-likelihood ratio (LLR) values. The full codeword is decoded using the first set of LLR values for the shortened codeword. The media controller dampens one or more LLR values corresponding to non-shortened bits of the codeword to produce a second set of LLR values and decodes the second set of LLR values.

Table 1 defines a list of acronyms employed throughout this specification as an aid to understanding the described embodiments:

TABLE 1

| BER | Bit Error Rate | DSP | Digital Signal Processing |
| ECC | Error Correction Code | HDD | Hard Disk Drive |
| IC | Integrated Circuit | I/O | Input/Output |

TABLE 1-continued

| LDPC | Low-Density Parity-Check | LLR | Log-Likelihood Ratio |
| LSB | Least Significant Bit | MLC | Multi-Level Cell |
| MSB | Most Significant Bit | NVM | Non-Volatile Memory |
| PCI-E | Peripheral Component Interconnect Express | SAS | Serial Attached SCSI |
| SATA | Serial Advanced Technology Attachment | SCSI | Small Computer System Interface |
| SoC | System on Chip | SSD | Solid State Disk |
| UBER | Uncorrectable Bit Error Rate | USB | Universal Serial Bus |

Figure 1:
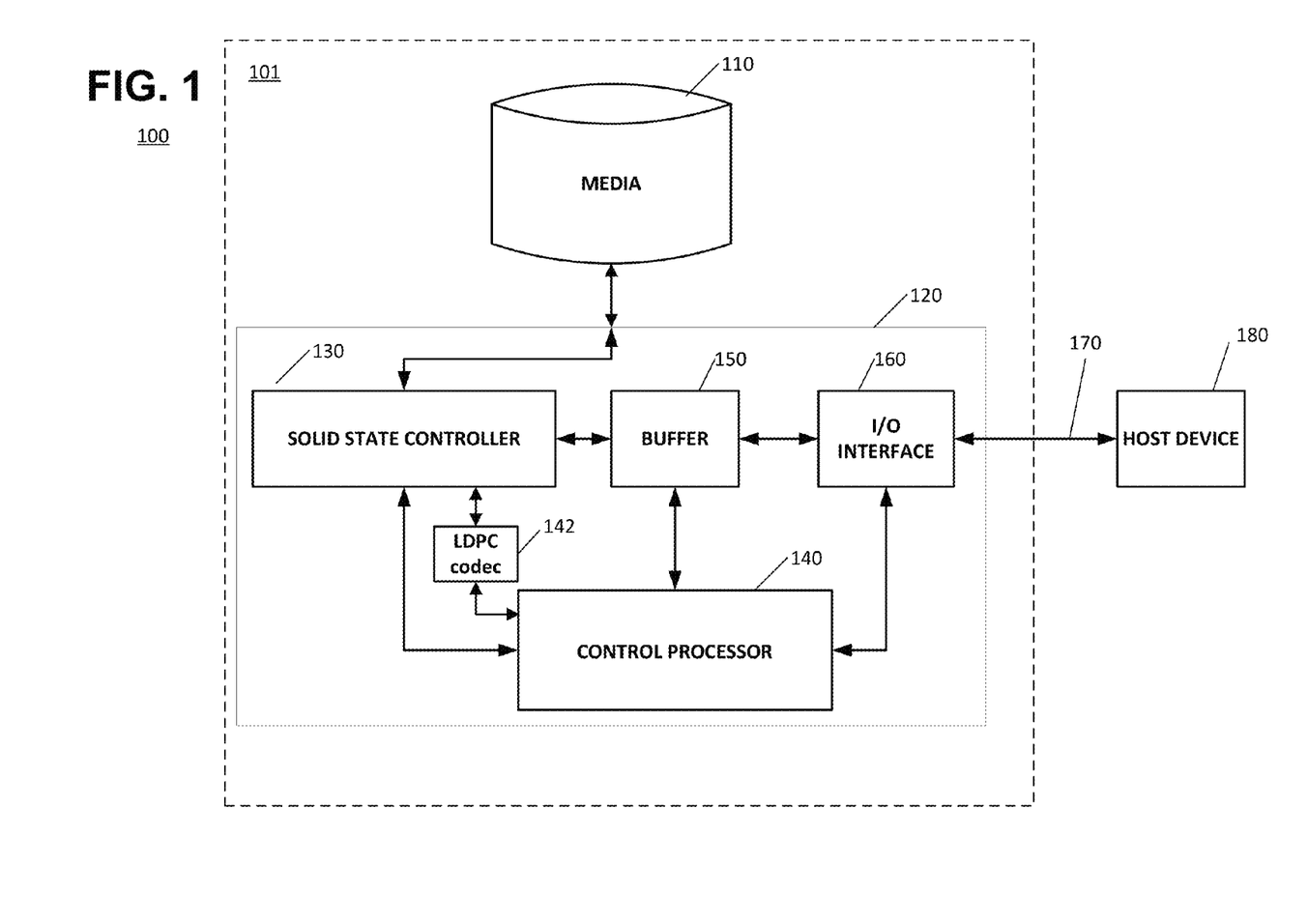
FIG. 1 shows a block diagram of a flash memory storage system in accordance with exemplary embodiments.

FIG. 1 shows a block diagram of non-volatile memory (NVM) storage system 100. NVM storage system 100 includes media 110, which is coupled to media controller 120. Media 110 might be implemented as a NAND flash solid-state disk (SSD), a magnetic storage media such as a hard disk drive (HDD), an optical storage media such as a compact disk (CD) or digital versatile disk (DVD), a hybrid solid-state and magnetic system or other similar storage systems. Media 110 might typically be coupled to media controller 120 by a physical transmission medium, such as a backplane, a drive head in a magnetic recording system, optical fibers, one or more coaxial cables, one or more twisted pair copper wires, or one or more radio frequency (RF) channels. Further, although described herein regarding an NVM storage system, described embodiments might additionally or alternatively be employed in a baseband processing system in a cellular phone or base station to decode data received through a wired or wireless channel or any system that decodes data received from a wired or wireless communications channel.

As shown in FIG. 1, media 110 and media controller 120 are collectively SSD 101. Media controller 120 includes solid state controller 130, control processor 140, buffer 150 and I/O interface 160. Media controller 120 controls transfer of data between media 110 and host device 180 that is coupled to communication link 170. Media controller 120 might be implemented as a system-on-chip (SoC) or other integrated circuit (IC). Solid state controller 130 might be used to access memory locations in media 110, and might typically implement low-level, device specific operations to interface with media 110. Buffer 150 might be a RAM buffer employed to act as a cache for control processor 140 and/or as a read/write buffer for operations between solid state media 110 and host device 180. For example, data might generally be temporarily stored in buffer 150 during transfer between solid state media 110 and host device 180 via I/O interface 160 and link 170. Buffer 150 might be employed to group or split data to account for differences between a data transfer size of communication link 170 and a storage unit size (e.g., read unit size, page size, sector size, or mapped unit size) of media 110. Buffer 150 might be implemented as a static random-access memory (SRAM) or as an embedded dynamic random-access memory (eDRAM) internal to media controller 120, although buffer 150 could also include memory external to media controller 120 (not shown), which might typically be implemented as a double-data-rate (e.g., DDR-3) DRAM.

Control processor 140 communicates with solid state controller 130 to control data access (e.g., read or write operations) data in media 110. Control processor 140 might be implemented as one or more Pentium®, Power PC®, Tensilica® or ARM processors, or a combination of different processor types (Pentium® is a registered trademark of Intel Corporation, Tensilica® is a trademark of Tensilica, Inc., ARM processors are by ARM Holdings, plc, and Power PC® is a registered trademark of IBM). Although shown in FIG. 1 as a single processor, control processor 140 might be implemented by multiple processors (not shown) and include software/firmware as needed for operation, including to perform threshold optimized operations in accordance with described embodiments. Control processor 140 is in communication with low-density parity-check (LDPC) coder/decoder (codec) 142, which performs LDPC encoding for data written to media 110 and decoding for data read from media 110.

Communication link 170 is used to communicate with host device 180, which might be a computer system that interfaces with NVM system 100. Communication link 170 might be a custom communication link, or might be a bus that operates in accordance with a standard communication protocol such as, for example, a Small Computer System Interface ("SCSI") protocol bus, a Serial Attached SCSI ("SAS") protocol bus, a Serial Advanced Technology Attachment ("SATA") protocol bus, a Universal Serial Bus ("USB"), a Universal Flash Storage ("UFS") protocol interface, an Ethernet link, an IEEE 802.11 link, an IEEE 802.15 link, an IEEE 802.16 link, a Peripheral Component Interconnect Express ("PCI-E") link, a Serial Rapid I/O ("SRIO") link, or any other similar interface link for connecting a peripheral device to a computer.

Figure 2:
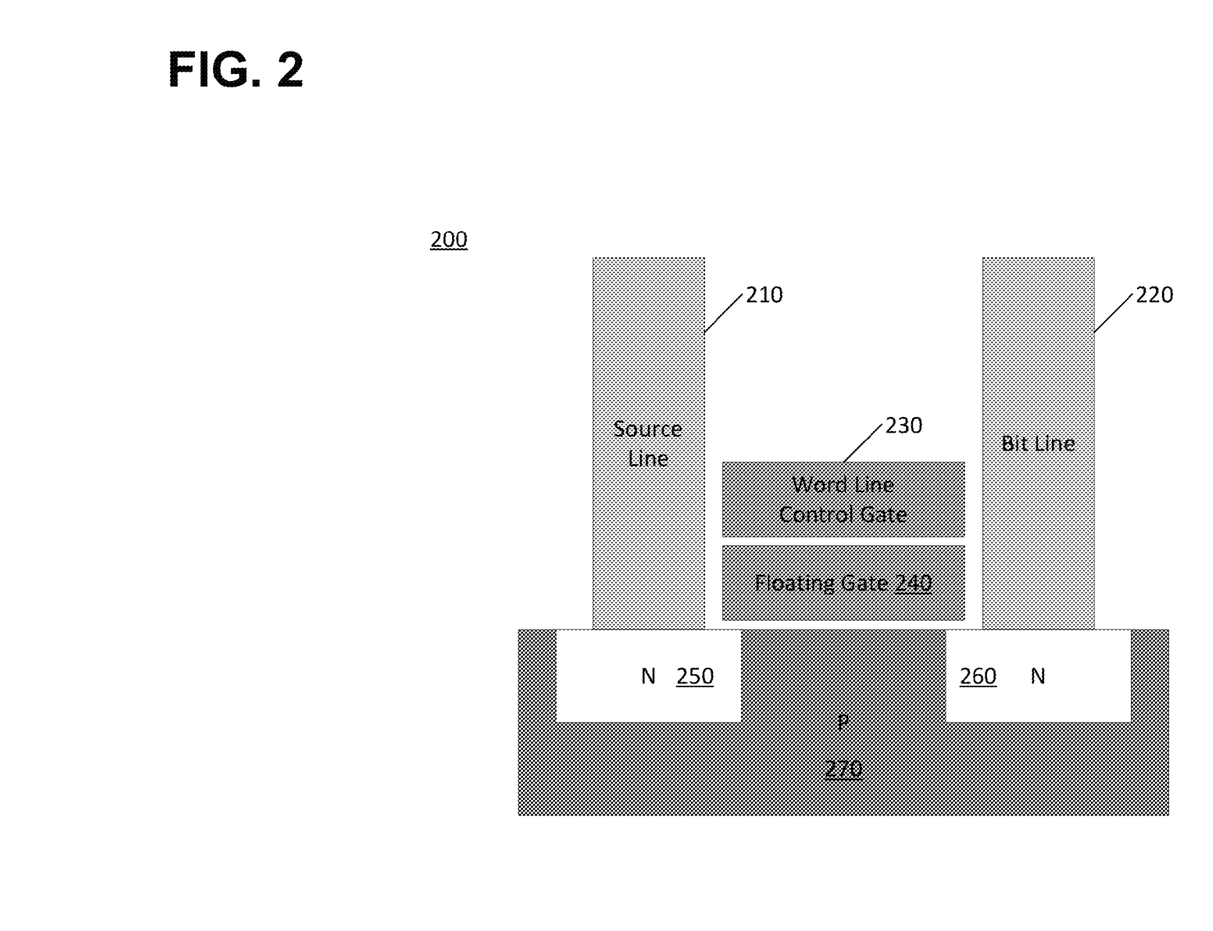
FIG. 2 shows an exemplary functional block diagram of a single standard flash memory cell.

FIG. 2 shows an exemplary functional block diagram of a single flash memory cell that might be found in solid state media 110. Flash memory cell 200 is a MOSFET with two gates. The word line control gate 230 is located on top of floating gate 240. Floating gate 240 is isolated by an insulating layer from word line control gate 230 and the MOSFET channel, which includes N-channels 250 and 260, and P-channel 270. Because floating gate 240 is electrically isolated, any charge placed on floating gate 240 will remain and will not discharge significantly, typically for many months. When floating gate 240 holds a charge, it partially cancels the electrical field from word line control gate 230 that modifies the threshold voltage of the cell. The threshold voltage is the amount of voltage applied to control gate 230 to allow the channel to conduct. The channel's conductivity determines the value stored in the cell, for example by sensing the charge on floating gate 240.

Figure 3:
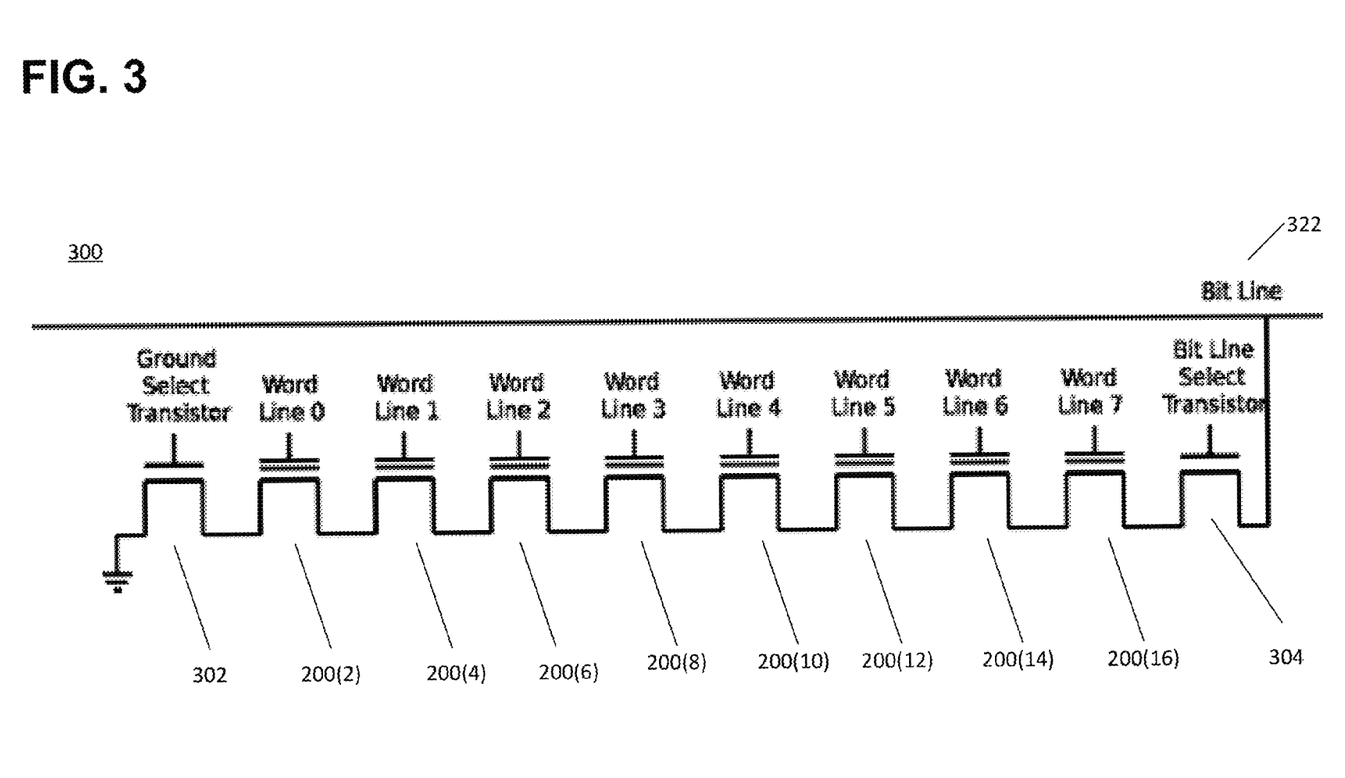
FIG. 3 shows an exemplary NAND MLC flash memory cell in accordance with exemplary embodiments.

FIG. 3 shows an exemplary NAND MLC flash memory string 300 that might be found in solid state media 110. As shown in FIG. 3, flash memory string 300 might include one or more word line transistors 200(2), 200(4), 200(6), 200(8), 200(10), 200(12), 200(14), and 200(16) (e.g., 8 flash memory cells), and bit line select transistor 304 connected in series, drain to source. This series connection is such that ground select transistor 302, word line transistors 200(2), 200(4), 200(6), 200(8), 200(10), 200(12), 200(14) and 200(16), and bit line select transistor 304 are all "turned on" (e.g., in either a linear mode or a saturation mode) by driving the corresponding gate high in order for bit line 322 to be pulled fully low. Varying the number of word line transistors 200(2), 200(4), 200(6), 200(8), 200(10), 200(12), 200(14), and 200 (16), that are turned on (or where the transistors are operating in the linear or saturation regions) might enable MLC string 300 to achieve multiple voltage levels. A typical MLC NAND flash might employ a "NAND string" (e.g., as shown in FIG. 3) of 64 transistors with floating gates. During a write operation, a high voltage is applied to the NAND string in the word-line position to be written. During a read operation, a voltage is applied to the gates of all transistors in the NAND string except a transistor corresponding to a desired read location. The desired read location has a floating gate.

As described herein, in both SLC and MLC NAND flash, each cell has a voltage charge level (e.g., an analog signal) that can be sensed, such as by comparison with a read threshold voltage level. A media controller might have a given number of predetermined voltage thresholds employed to read the voltage charge level and detect a corresponding binary value of the cell. For example, for MLC NAND flash, if there are 3 thresholds (0.1, 0.2, 0.3), when a cell voltage level is $0.0 \leq$ cell voltage$<0.1$, the cell might be detected as having a value of [00]. When reading a typical MLC flash, three read thresholds are originally set to default values programmed by the flash manufacturer. If ECC is unsuccessful, the three thresholds are modified to re-read the data. If the cell voltage level is $0.1 \leq$ cell voltage$<0.2$, the value might be [10], and so on. Thus, a measured cell level might typically be compared to the thresholds one by one, until the cell level is determined to be in between two thresholds and can be detected. Thus, detected data values are provided to a decoder of memory controller 120 to decode the detected values (e.g., with an error-correction code) into data to be provided to host device 180.

Described embodiments employ Low-Density Parity-Check (LDPC) decoders to decode data stored in the flash memory (e.g., LDPC codec 142 of FIG. 1). LDPC decoders can approach the Shannon limit in terms of correction ability. Unlike decoders employing algebraic codes, though, LDPC decoders do not have a fixed correction ability (such as in bits of errors correctable per codeword). Further, LDPC decoders are susceptible to trapping sets in their Tanner graph creating an "error floor"—a change in the normal "waterfall" characteristic of output bit-error-rate versus input bit-error-rate where the output bit-error-rate suddenly changes to a much less steep slope. However, to more efficiently employ LDPC codes, LDPC decoders employ "soft" data, such as the analog-like probability that each bit being decoded has a given value (e.g., each cell has a specific charge level). This probability of a decoded bit having a given value is generally specified as a Log-Likelihood Ratio (LLR). In flash memories, for example, the ability to move the threshold voltage for bit detection during read operations enables taking multiple samples of the bit values to determine how reliable each bit is, and this reliability can then be expressed as an LLR for each bit. As described herein, a part of soft-decision LDPC decoding of flash memory is employing one or more reads of a given flash cell (each at a different threshold voltage) to generate an LLR for each bit position.

Figure 4:
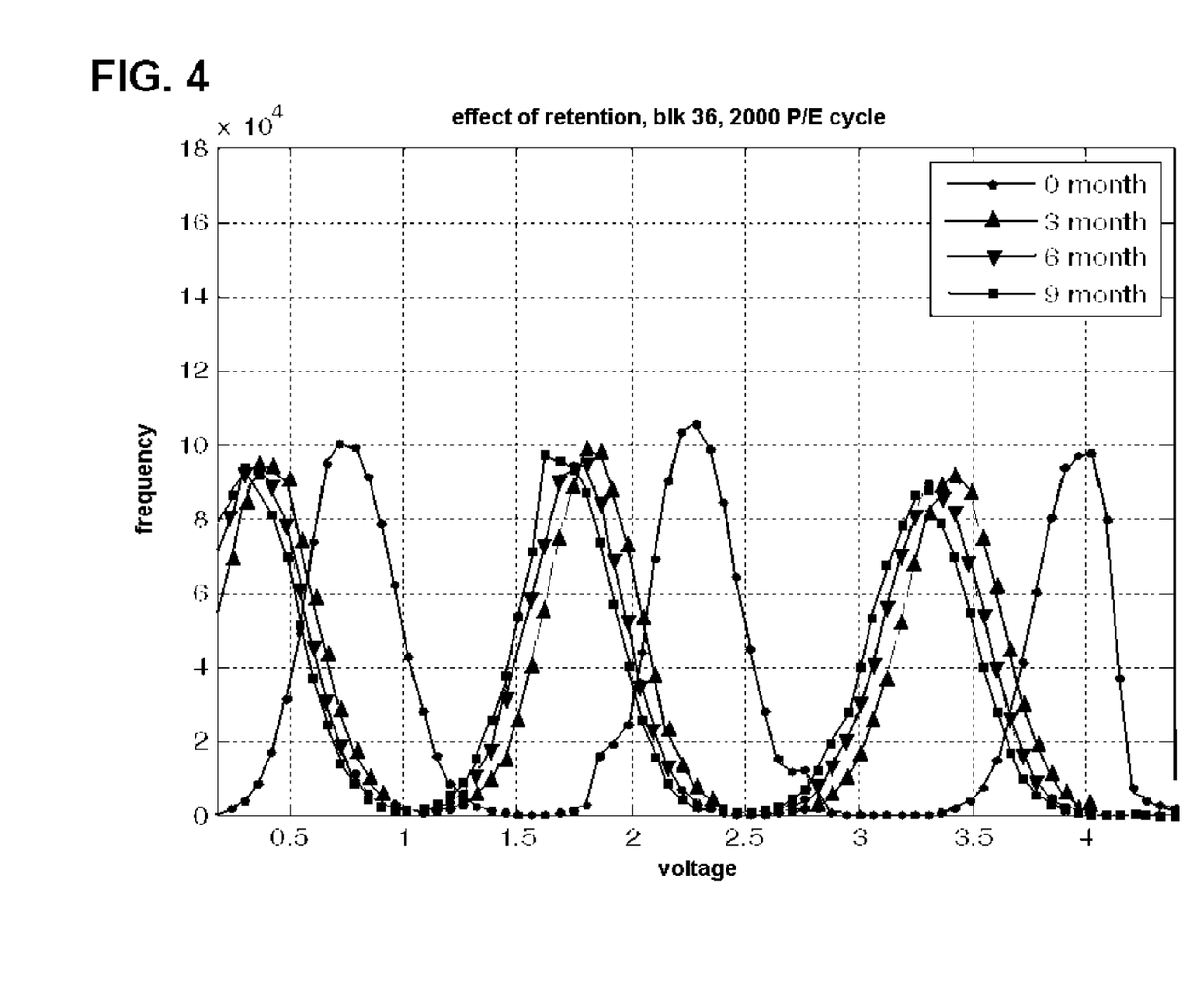
FIG. 4 shows an exemplary diagram of the variation of voltage distribution of state bit values in the MLC NAND flash cell of FIG. 3 over time.

For example, FIG. 4 illustrates how the voltage distribution of state (bit values) in an MLC NAND flash cell varies over time. Notably, not all bits will drift identically, leading to variations when reading with a single, fixed voltage threshold. Further, some of the bits may be "stuck," such as by reporting an incorrect value, rather than merely a value that has drifted from its correct position. Described embodiments enable LDPC decoders to overcome the effects of "stuck" bits (bits that are incorrect, but claim with high probability that they are correct) by changing the Log-Likelihood Ratio (LLR) used for all bits, except for "shortened" bits that are part of the codeword but are not transmitted/stored.

Figure 5A:
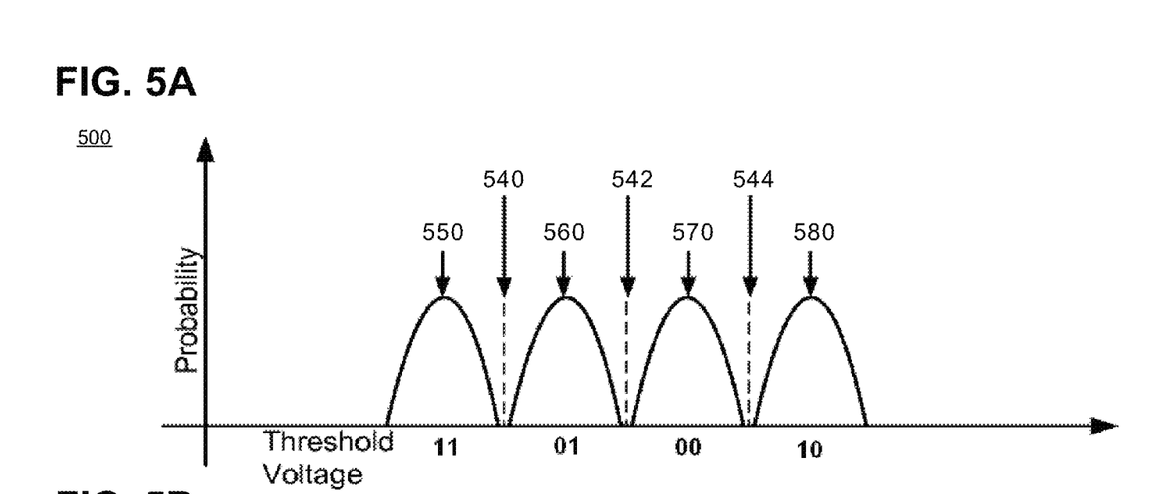
FIG. 5A shows an exemplary diagram of the threshold voltage probability distributions of the MLC NAND clash cell of FIG. 3 at an initial time.
Figure 5B:
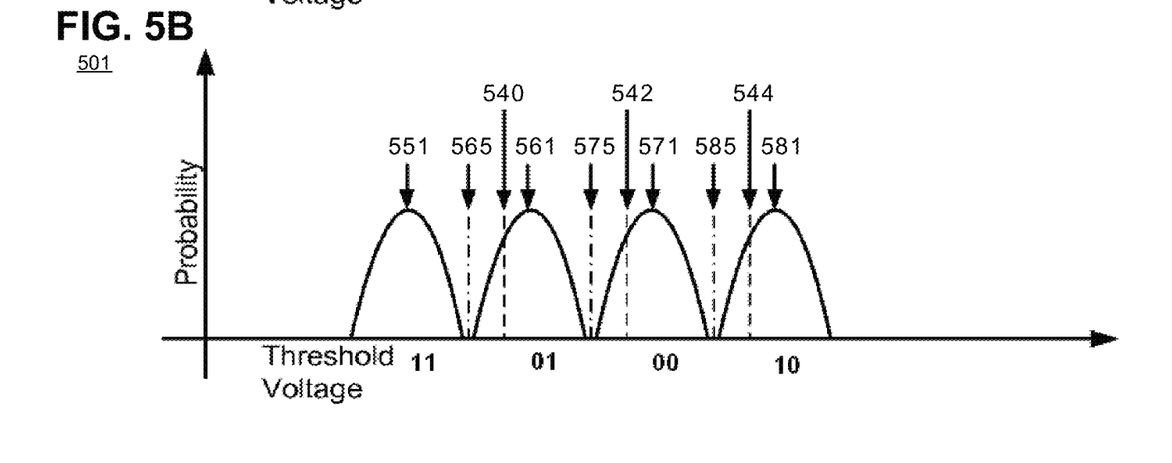
FIG. 5B shows an exemplary diagram of shifted threshold voltage probability distributions of the MLC NAND clash cell of FIG. 3 at a later time.

FIGS. 5A and 5B show exemplary diagrams of the threshold voltages and threshold voltage probability distributions of an MLC NAND flash cell such as shown in FIG. 3. FIG. 5A represents the threshold voltage probability distributions at an initial time (e.g., when the data is written) for Gray coded MLC states 11 (e.g., distribution 550), 01 (e.g., distribution 560), 00 (e.g., distribution 570), and 10 (e.g., distribution 580). As shown, nominal read thresholds 540, 542 and 544 are ideally located between each MLC state. FIG. 5B represents the threshold voltage probability distributions at a later time. As shown in FIG. 5B, threshold voltage distributions 551, 561, 571, and 581 are shifted, such as by retention drift, with respect to their earlier respective threshold voltage distributions 550, 560, 570, and 580 shown in FIG. 5A. Although FIG. 5B shows all four distributions uniformly shifted to the left, in practice, the distributions generally might shift independently of each other. Further, the direction of the shifts in the threshold voltage distributions are not generally known or directly knowable. Still further, the shift might be independent in each bit, the shift may also cause the distributions to widen, and the widening may be asymmetrical.

In some embodiments, various scrambling techniques are used such that the statistical distribution of the four states is 25 percent for each state. When the MLC cell having shifted distributions (e.g., such as shown in FIG. 5B) is read using the nominal read thresholds (e.g., 540, 542 and 544, which are situated for the non-shifted distribution locations shown in FIG. 5A), then a deviation from the expected read data of 25 percent for each state (over many samples) might be observed (e.g., prior to any error correction). Media controller 120 might employ this disparity in the read data states to infer the existence of shifts in the threshold voltage distributions. Media controller 120 might then adjust the nominal read thresholds (e.g., 540, 542 and 544) based at least in part on the observed disparity to become shifted read thresholds 565, 575 and 585 as shown in FIG. 5B. In some embodiments, disparities might be evaluated on an entire page basis (or multiple page basis). In other embodiments, disparities might be evaluated on a read unit and/or codeword basis. Although not shown in FIGS. 4A and 4B, for SLC cells, there might be two states (e.g., 1 and 0) and a single read threshold. Scrambling might be employed such that the statistical distribution of the two states is 50 percent for each state. Read thresholds might typically be shifted as described in related U.S. patent application Ser. No. 13/464,433 filed May 4, 2012, incorporated herein by reference.

Thus, as can be seen in FIGS. 5A and 5B, when reading the least significant bit (LSB), voltages less than the threshold reference are read as a 1. As can be seen, $V_4$ will tend to sample more bits as 1, and $V_0$ will tend to sample more bits as 0. And bits sampled by $V_2$, in the center of the two distributions, are sometimes indeterminate. Based on exactly where each cell has its voltage threshold (crossing from 1 to 0), a likelihood that the cell is actually holding a 1 or 0 can be determined, but this likelihood can vary over time (as indicated by the difference between FIG. 5A and FIG. 5B). A part of soft-decision LDPC decoding of NAND flash memory is turning one or more reads of the NAND flash (each at a different threshold voltage) into an LLR for each bit position. An order in which multiple reads of the NAND flash at different thresholds are performed varies, according to various embodiments, based on factors such as static and/or dynamic tracking information (such as distribution tracking information), observed disparity of the reads, observed error rates from decoding attempts, and other factors.

Figure 6A:
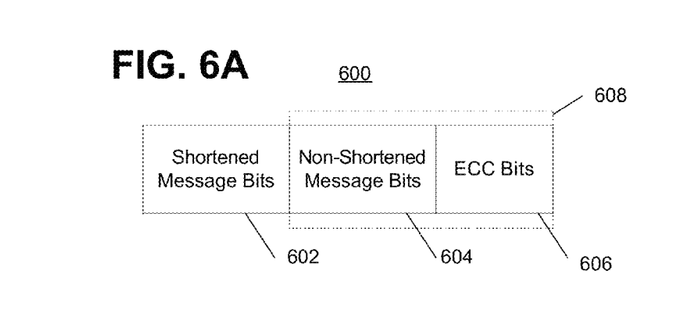
FIG. 6A shows an exemplary non-shortened codeword stored on the storage media of FIG. 1.
Figure 6B:
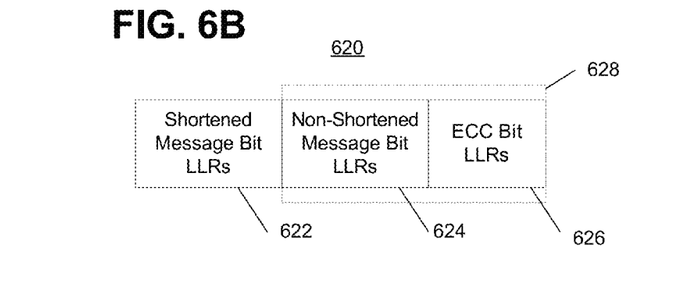
FIG. 6B shows an exemplary shortened codeword stored on the storage media of FIG. 1.

In many practical cases, codewords are shortened. Shortening means that there are codeword positions, such as some message bit positions, that are unused and are effectively known when both encoding and decoding without being stored/transmitted. Shortened codewords might be employed to support variable sizes of codewords and provide greater flexibility in code rate selection. For example, if the number of check bytes is fixed but different NAND flash vendors provide differing amounts of spare area, then the number of user bytes per codeword can be changed by shortening the codeword to accommodate the differing amounts of spare area. FIG. 6A shows an exemplary shortened codeword 600 that is stored on media 110. As shown in FIG. 6A, shortened codeword 600 includes shortened message bits 602, non-shortened message bits 604 and ECC bits 606. Together, non-shortened message bits 604 and ECC bits 606 form non-shortened codeword portion 608 that is stored on media 110. FIG. 6B shows an exemplary shortened codeword 620 that is read from media 110. As shown in FIG. 6B, shortened codeword 620 includes some shortened message bit LLRs 622, some non-shortened message bit LLRs 624 and ECC bit LLRs 626. Together, non-shortened message bit LLRs 624 and ECC bit LLRs 626 form non-shortened codeword portion 628 corresponding to data that is read from media 110.

For example, a first NAND flash vendor might employ a spare area of 1216 bytes per 16 KB page of user data, and a second NAND flash vendor might employ a spare area of 1280 bytes per 16 KB page of user data. In an exemplary embodiment having 144 bytes of LDPC check bits per 2 KB codeword, the first vendor's NAND flash could employ eight instances of a (2200B, 2056B) code, and the second vendor's NAND flash could employ eight instances of a (2208B, 2064B) code, efficiently using all the bytes in each page for each vendor's memory. Depending on the implementation, the LDPC encoder and decoder (e.g., LDPC codec 142 of FIG. 1) might implement a larger size codeword, such as 2176 bytes of user data, a (2320B, 2176B) code with 144 bytes of LDPC check bits. Both the (2200B, 2056B) code and the (2208B, 2064B) code would then be shortened versions of the implemented codeword.

Certain channels might have errors known as "stuck bit" errors, which are errors that appear strongly to be one value (e.g., 0), but actually should be another value (e.g., 1). Stuck bit errors might be due to one or more of: (1) static stuck bits—such as bits that cannot be written/programmed and always read as a fixed value (e.g., one or more shorted or open transistors in NAND MLC flash memory string 300 of FIG. 3); (2) mis-programming—in some technologies that store multiple bits per cell, such as multi-level cell (MLC) flash, if the LSB of a cell is mis-read when programming the MSB of that cell, the resulting charge state is based on the incorrect LSB, resulting in a "stuck" bit in the LSB and/or MSB positions of that cell; (3) Single Event Upsets (SEUs)—if the data that is being sent to be written/programmed experiences any errors (such as due to alpha particles) prior to writing/programming, then the bits in error are programmed to the wrong value.

Since such "stuck bit" errors appear very strongly to have a given value (e.g., a high magnitude LLR), when in actuality the bits should be the opposite value, stuck bit errors thus can create errors in LDPC decoding Such stuck bit errors raise an error floor for LDPC decoding by "lying" strongly about their value, and might exacerbate a "trapping set issue". A trapping set issue is when the LLR value strongly indicates the bit is a 0, but in reality the bit is a 1, and the other bits in the trapping set are unable in some cases to over-rule the strength of the erroneous bit. Described embodiments selectively modify the LLR in non-shortened bit positions to raise the relative "certainty" of shortened bit positions. This helps LDPC decoding overcome stuck bits and lowers the error floor in the presence of stuck bits.

An LDPC decoder generally treats shortened positions as having the maximum magnitude of LLR. Other (non-shortened) bit positions have an LLR determined from their actual likelihood of having the given value, as determined by analog data obtained from the storage/transmission media (e.g., a measured cell level compared to the various thresholds such as shown in FIGS. 5A and B to determine a likelihood for each bit).

In some embodiments, the shortened bit positions are always treated as zero on encoding (and similarly on decoding) In other embodiments, the shortened bit positions are always treated as one on encoding (and similarly on decoding). In other embodiments, some or all of the shortened bit positions are treated as having a specified pattern, such as alternating zeroes and ones, on encoding (and similarly on decoding). Thus, according to described embodiments, the LLR for shortened bit positions might be treated as having the maximum LLR magnitude or as having an infinite LLR magnitude, and is prevented from being changed during the decoding process. For example, in some embodiments, the shortened bit positions have a special encoding for "infinite" magnitude, and logic in the LDPC decoder is modified to treat the value "infinity" specially (such as according to its mathematical meaning, or such as being much larger than any other value). Having a special "infinite" LLR magnitude for the shortened bit positions reinforces the "certainty" of those bit positions such that those bit positions are "guaranteed" to be correct, which is not the case for non-shortened bit positions, even non-shortened bit positions with a high-magnitude LLR value, in the presence of stuck bits. In other embodiments, the LLR in shortened bit positions is set to the maximum possible LLR magnitude at the initial LDPC decoding step (e.g., at the start of a first iteration of an iterative LDPC decoding process), and is not allowed to change in subsequent LDPC decoding iterations. Even if the LLR of the shortened bit positions is allowed to change, the LLR in the shortened bit positions is unlikely to change to a wrong value (e.g., a wrong sign) by virtue of their reliable initial magnitudes.

During decoding, the LLR for stuck bits is determined as for any other non-shortened bit, for example by determining an analog level for the bit and determining a probability of the bit being a 0 or a 1. For stuck bits, though, the analog level for the bit is incorrect. The stuck bits thus have a high LLR magnitude, such as a maximum-valued LLR, and potentially raise an error floor, limiting the output bit error rate of the LDPC Decoder. Specifically, the stuck bits prevent the LDPC decoder from converging on a solution by increasing the likelihood of the LDPC decoder getting caught in a trapping set. When this happens, the LDPC decoding fails. LDPC decoding might be repeated multiple times using more and more precise LLR information. For example, if hard-decision LDPC decoding fails, one or more additional reads of the NAND flash memory are done at different threshold voltages to get first-order LLR information, and LDPC decoding is repeated with this soft-decision information. If LDPC decoding fails again, further additional reads of the NAND flash memory are done, such as at intermediate threshold voltages, to get second-order LLR information, and LDPC decoding is repeated with this improved soft-decision information. If LDPC decoding fails again, various embodiments have even further fallback strategies such as DSP techniques, or some type of higher-level code across multiple codewords (e.g., a RAID5-like code).

In the presence of stuck bits, the repeated read retries and LDPC decoding do not improve the LDPC decoding, since the stuck bits do not change and instead maintain the incorrect state. The further fallback strategies tend to be very processing intensive and might still not be able to correct for the stuck bits.

Figure 7:
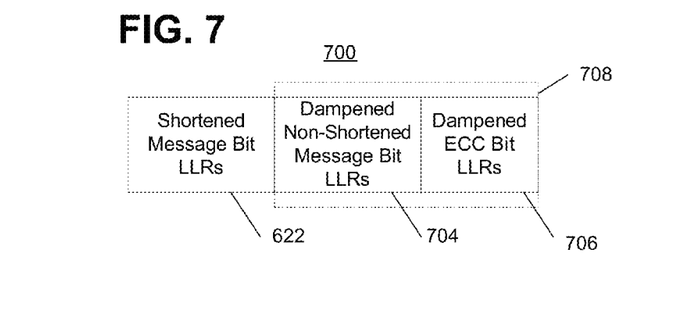
FIG. 7 shows an exemplary dampened version of the shortened codeword of FIG. 6B.

In various embodiments, when a soft-decision LDPC decoding step fails, non-shortened bit positions have their LLR value dampened (decreased in magnitude) while shortened bit positions maintain their (e.g., maximal) LLR value. LDPC decoding is then repeated. Dampening the non-shortened bit positions has the effect of reducing the LLR magnitude of the stuck bits as compared to shortened bit positions, thus giving the LDPC decoder a greater ability to determine which bits have the correct value. After dampening is applied to the non-shortened bit positions, LDPC decoding is tried again with the updated LLR. Dampening might be repeated, for example, if a first, slight dampening does not result in successful LDPC decoding, one or more additional, more aggressive dampening steps can be performed and LDPC decoding retried. Thus, dampening and repeating LDPC decoding is done at one or more stages of the decoding process. FIG. 7 shows an exemplary dampened, shortened codeword 700 (e.g., a dampened version of codeword 620 of FIG. 6B) that includes shortened message bit LLRs 622, dampened non-shortened message bit LLRs 704 and dampened ECC bit LLRs 706, such that all non-shortened positions of codeword 620 are dampened (e.g., dampened non-shortened message bit LLRs 704 are dampened versions of non-shortened message bit LLRs 624 and dampened ECC bit LLRs 706 are dampened versions of ECC bit LLRs 626). Shortened message bit LLRs 622 are not dampened.

Figure 8:
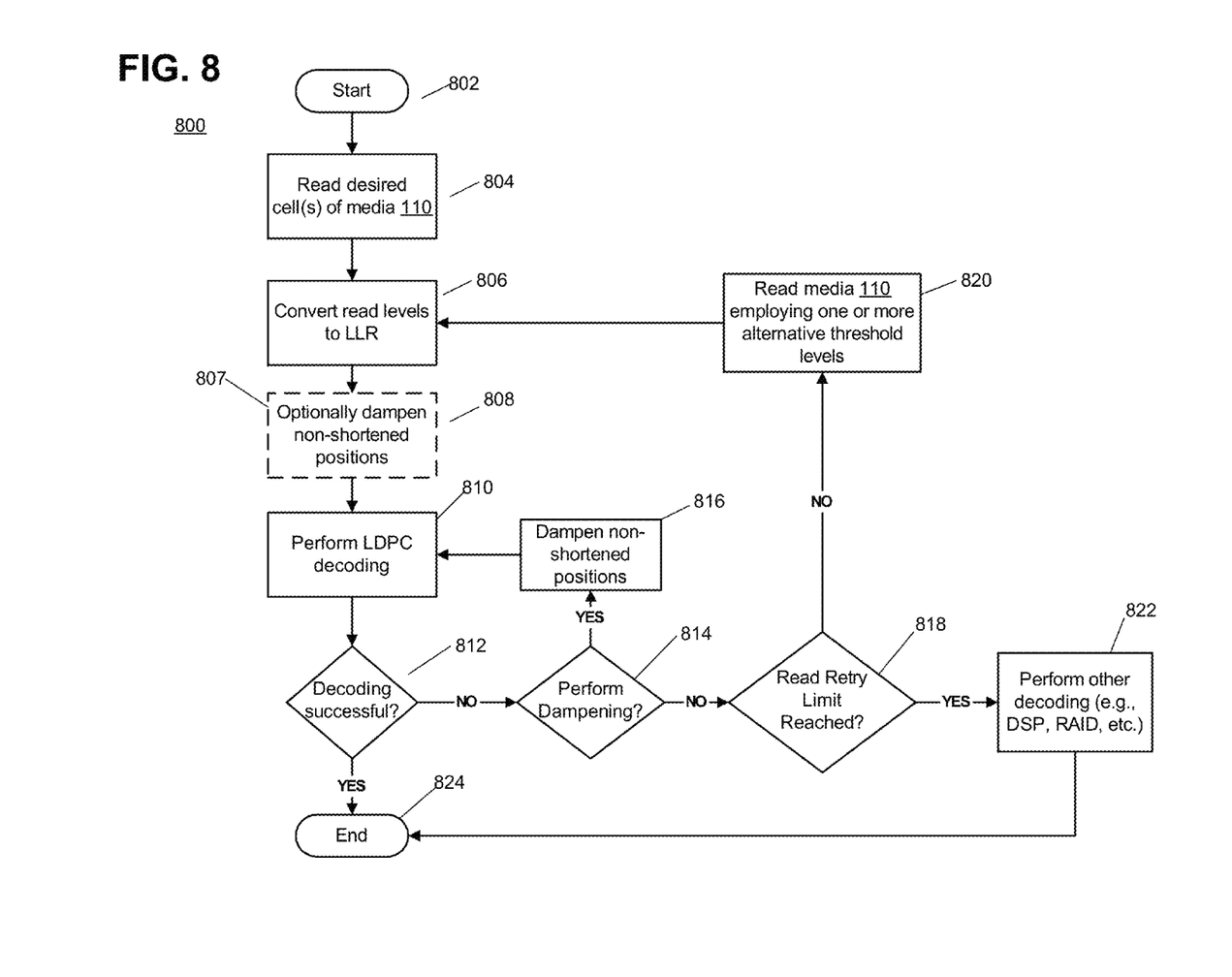
FIG. 8 shows a flow diagram of an exemplary LDPC decoding algorithm of the flash memory storage system of FIG. 1 in accordance with exemplary embodiments.

FIG. 8 shows a flow diagram of an exemplary LDPC decoding process 800 of a non-volatile memory (e.g., an MLC NAND flash memory). At step 802, LDPC decoding process 800 starts. At step 804, a first read of one or more cells (e.g., as shown in FIG. 3) of media 110 is performed to determine a first analog level of each of the one or more cells. At step 806, the analog levels for each of the one or more cells is converted to an LLR value to determine a bit value corresponding to each LLR value. As indicated by dashed line 807, at optional step 808, non-shortened bit positions might be dampened before performing LDPC decoding at step 810. At step 810, LDPC decoding is performed on the LLR values for each of the one or more cells in the codeword. At step 812, if LDPC decoding is successful, process 800 proceeds to step 824. At step 812, if LDPC decoding (either with, or without optional dampening step 808) was not successful, process 800 proceeds to step 814 where it is determined whether dampening of non-shortened positions should be performed. If, at step 814, dampening should be performed, at step 816, non-shortened bit positions of a codeword are dampened, and process 800 returns to step 810 where LDPC decoding is performed on the LLR values for each of the one or more cells in the codeword. If, at step 814 dampening should not be performed, at step 818 it is determined whether a read retry limit of media controller 120 has been reached. If, at step 818, the read retry limit has not been reached, then, at step 820, a subsequent read of the one or more cells of media 110 is performed with one or more alternative threshold levels (e.g., as shown in FIGS. 5A and B) to refine the determined voltage level. After the subsequent read operation is performed at step 820, process 800 returns to step 806 where the refined analog levels for each of the one or more cells is converted to an LLR value to determine a bit value corresponding to each LLR value. If, at step 818, the read retry limit has been reached, then, at step 822, one or more additional decoding methods might be attempted to recover the data (e.g., digital signal processing (DSP), etc.). At step 824, process 800 completes and recovered data might further be processed by media controller 120.

Thus, in described embodiments, dampening and repeating LDPC decoding is attempted every time LDPC decoding (without dampening) fails, such as in parallel with additional reads to get more precise soft-decision information. In some exemplary embodiments, dampening and repeating LDPC decoding is solely done when LDPC decoding after all desired additional reads (to get further soft-decision information) has failed. Dampening and repeating LDPC decoding is not necessarily the final attempt, as DSP might be done either before or after dampening, and use of higher-level coding across multiple codewords (e.g., a RAID5-like code) is generally the last recovery attempt. When stuck bit errors are more prevalent, dampening is done for every LDPC decoding so that only non-shortened bit positions are enabled to have the maximum LLR value. A first attempt at dampening might be performed at a first dampening level, and if LDPC decoding fails, one or more stronger levels of dampening might be applied for further LDPC decoding attempts.

When hard errors are the culprit in getting LDPC decoding stuck in a trapping set, the LDPC decoding generally gets stuck in a single "small" trapping set. The size of the trapping set (a number of participating erroneous bits nodes and unsatisfied check nodes) is determined by the Tanner graph corresponding to the parity check matrix of the LDPC code, specifically the column weight and the graph's short-cycle spectrum. Example small trapping sets include (4,2), and (4,4), which mean 4 erroneous bit nodes and 2 and 4 unsatisfied checks, respectively. When LDPC decoding is stuck in such a small trapping set, this is determinable by a syndrome weight, or equivalently by a number of unsatisfied checks. If after the LDPC decoding reaches the maximum number of allowable iterations, it is found that the syndrome weight is small or has been small (e.g., between 1 and 6) for the last few iterations, then this is likely indicative of hard errors inducing a small trapping set. In response, it is effective to use more aggressive dampening rather than additional read retries, as read retries can not reliably detect hard errors (such as when the written analog voltage is beyond the voltage window bounded by the minimum and maximum read reference voltages).

Figure 9:
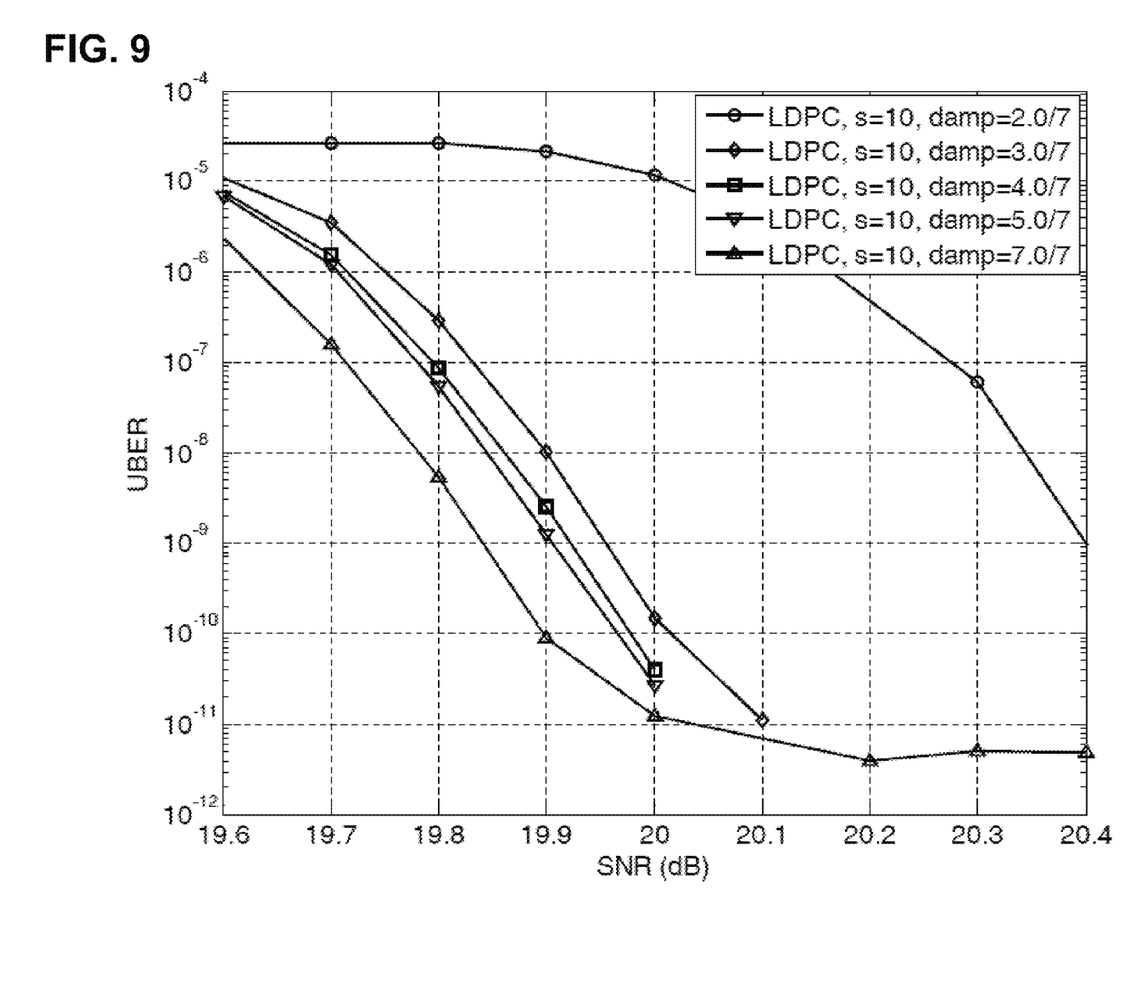
FIG. 9 shows an exemplary chart of shows the error floor of uncorrectable bit errors over signal to noise ratio with and without dampening, in accordance with the LDPC decoding algorithm of FIG. 8.

Dampening is performed by applying a ratio to the LLR of all the non-shortened bit positions. For example, if the LLR ranges from −7 to +7, the non-shortened bit positions are multiplied by a dampening factor, such as 5/7, or 4.5/7, or 4/7. The shortened bit positions maintain their maximal LLR (e.g., +7 or −7). FIG. 9 shows the error floor without dampening (triangles) versus various results with dampening using multiplicative dampening factors 2/7, 3/7, 4/7, and 5/7. In FIG. 9, s=10 indicates that 10 stuck bit errors are present per codeword, UBER denotes uncorrectable bit error rate after LDPC decoding, and SNR is signal-to-noise ratio. In some embodiments, dampening is performed by selectively decreasing the magnitude of LLR values of any non-shortened bit position that is greater than a specified threshold. In a first example (using LLR values ranging from −7 to +7), any LLR value with magnitude greater than 4 has its magnitude decreased to 4. In a second example (using LLR values ranging from −7 to +7), any LLR value with magnitude greater than 5 has its magnitude decreased by 1. In a third example, any LLR value with maximal magnitude has its magnitude decreased by a specified amount, such as one or two. Alternatively, the dampening could be any function applied to the LLR of the non-shortened bit positions, such as an exponential decay (dampening larger magnitude LLR values more than smaller LLR values), a step function, a quadratic function, or any other mathematical function.

In some embodiments, dampening is asymmetrical, based on knowledge of the likelihood of certain types of failures. For example, if the value 1 has a positive LLR and the value 0 has a negative LLR, and if stuck bits are more likely to have the value 1 than the value 0, then asymmetrical dampening dampens positive LLR values more strongly the negative LLR values. Further in the example, if it is very unlikely for any stuck bits to have the value 0, then only positive LLR values are dampened.

In embodiments employing MLC NAND flash, knowledge of the value of the other bit stored in a same cells (e.g., the LSB bit value for an MSB bit being decoded, or the MSB bit value for an LSB bit being decoded, etc.) combined with knowledge of the likelihood of how stuck bit failures affect cells, enables selective dampening of each bit position based on knowledge of a value of the other bit stored in the same cell. For example, when decoding a lower page, reading and decoding the upper page provides additional information to selectively dampen LLR values used for the lower-page decoding Thus, LLR values might be produced by converting one or more samples taken by reading a given portion of the NAND flash (such as one or more codewords) at respective threshold voltages. In further embodiments, a table-lookup is used to convert the samples taken at each bit position into an LLR value for that bit position. The table is computed in advance, such as by firmware, based on static or dynamic knowledge of the state distributions of the cells in the portion of the NAND flash being read. In still further embodiments, the samples are ordered by the respective threshold voltage and the conversion is enabled to use an index of a transition point (such as from 1 to 0, or from 0 to 1) to determine the LLR value.

According to various embodiments, LLR values are generated by one or more of: the LDPC decoder; a dedicated hardware unit; firmware; and other similar techniques. According to various embodiments, the LLR dampening is done by one or more of: the LDPC decoder as a pre-processing step; firmware changing LLR values provided in a lookup table; directly modifying LLR values stored in a memory; and other similar techniques.

Exemplary embodiments employ a systematic code where ECC bits are at the end of the message bits (e.g., as shown FIGS. 6A-B and 7). However, in some embodiments, ECC bits might be anywhere (middle, front) within the data, and the code might be non-systematic, which means the LDPC decoder (e.g., 142) cannot distinguish between message and ECC bits. In this case, the decoder distinguishes between shortened bits (e.g., 602), and non-shortened bits (e.g., 604) such that all bits are "coded" and the ECC information and data are interleaved together according to a mathematical algorithm.

Thus, described embodiments provide a media controller to read data stored in a media. The media controller determines a value for each bit of a shortened codeword from the media. The shortened codeword includes a plurality of non-shortened bits of a full codeword, where the full codeword includes the plurality of non-shortened bits and one or more shortened bits. Shortened bits correspond to bits unused in the shortened codeword that are set to a default value. The media controller converts the determined values for each bit of the shortened codeword into a first set of log-likelihood ratio (LLR) values. The full codeword is decoded using the first set of LLR values for the shortened codeword. The media controller dampens one or more LLR values corresponding to non-shortened bits of the codeword to produce a second set of LLR values and decodes the second set of LLR values.

Reference herein to "one embodiment" or "an embodiment" means that a particular feature, structure, or characteristic described in connection with the embodiment can be included in at least one embodiment. The appearances of the phrase "in one embodiment" in various places in the specification are not necessarily all referring to the same embodiment, nor are separate or alternative embodiments necessarily mutually exclusive of other embodiments. The same applies to the term "implementation." As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

While the exemplary embodiments have been described with respect to processing blocks in a software program, including possible implementation as a digital signal processor, micro-controller, or general purpose computer, the described embodiments are not so limited. As would be apparent to one skilled in the art, various functions of software might also be implemented as processes of circuits. Such circuits might be employed in, for example, a single integrated circuit, a multi-chip module, a single card, or a multi-card circuit pack.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements. Signals and corresponding nodes or ports might be referred to by the same name and are interchangeable for purposes here.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

Described embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other non-transitory machine-readable storage medium, wherein, when the program code is loaded into and executed by a machine, such as a computer, the machine becomes an apparatus for practicing the described embodiments. Described embodiments might also be implemented in the form of program code, for example, whether stored in a non-transitory machine-readable storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the described embodiments. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus such as described herein.

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments.

It will be further understood that various changes in the details, materials, and arrangements of the parts which have been described and illustrated in order to explain the nature of described embodiments might be made by those skilled in the art without departing from the scope of the following claims.

We claim:

1. A method of reading, by a controller, data from at least one of a storage media and a communication channel, the method comprising:
   determining a value for each bit of a shortened codeword of the read data, wherein the shortened codeword comprises a plurality of non-shortened bits of a full codeword, the full codeword comprising the plurality of non-shortened bits and one or more shortened bits, the shortened bits corresponding to bits unused in the shortened codeword;
   converting the determined values for each bit of the shortened codeword into a first set of log-likelihood ratio (LLR) values;
   decoding the full codeword using the first set of LLR values for the shortened codeword;
   dampening one or more LLR values of the first set of LLR values, the one or more LLR values corresponding to non-shortened bits of the codeword to produce a second set of LLR values, wherein the dampening comprises:
      setting one or more LLR values corresponding to shortened bits of the shortened codeword to an associated maximum LLR magnitude; and
   decoding the second set of LLR values,
   wherein the step of dampening one or more LLR values is performed only if the decoding of the first set of LLR values did not successfully recover data corresponding to the shortened codeword.

2. The method of claim 1, wherein the step of dampening one or more LLR values comprises:
   decreasing a magnitude of one or more of the LLR values of the first set of LLR values by a predetermined amount.

3. The method of claim 2, wherein the one or more LLR values decreased in magnitude have a maximum LLR magnitude.

4. The method of claim 1, wherein the step of dampening one or more LLR values comprises:
scaling a magnitude of one or more of the LLR values of the first set of LLR values by a predetermined scaling factor.

5. The method of claim 1, wherein the step of dampening one or more LLR values dampens LLR values such that all non-shortened positions of the codeword have less than a maximum magnitude LLR value.

6. The method of claim 1, wherein the step of decoding is low-density parity check (LDPC) decoding.

7. The method of claim 1, further comprising:
dampening one or more LLR values of the first set of LLR values before decoding the first set of LLR values for the shortened codeword.

8. The method of claim 1, further comprising:
if the decoding did not successfully recover data corresponding to the shortened codeword from the second set of LLR values:
dampening one or more LLR values of the second set of LLR values, the one or more LLR values corresponding to non-shortened bits of the codeword to produce a third set of LLR values; and
decoding the third set of LLR values.

9. The method of claim 8, wherein:
the dampening of the first set of LLR values is performed by decreasing a magnitude of one or more of the LLR values of the first set of LLR values by a first predetermined amount; and
the dampening of the second set of LLR values is performed by decreasing the magnitude of one or more of the LLR values of the second set of LLR values by a second predetermined amount.

10. The method of claim 8, wherein:
the dampening of the first set of LLR values is performed by scaling a magnitude of one or more of the LLR values of the first set of LLR values by a first scaling factor; and
the dampening of the second set of LLR values is performed by scaling the magnitude of one or more of the LLR values of the second set of LLR values by a second scaling factor.

11. The method of claim 1, wherein the determined values are at least one of binary data or an analog voltage level.

12. The method of claim 11, wherein the step of converting the determined values for each bit of the shortened codeword into a first set of log-likelihood ratio (LLR) values is performed employing a first threshold level.

13. The method of claim 12, further comprising:
if a threshold number of dampening operations is reached:
determining whether a read retry limit of the controller is reached;
if the read retry limit is not reached:
re-reading values for each bit of the shortened codeword from the storage media;
converting, employing one or more subsequent threshold levels, the determined values for each bit of the shortened codeword into a subsequent set of log-likelihood ratio (LLR) values;
re-performing the steps of dampening and decoding employing the subsequent set of LLR values.

14. The method of claim 13, further comprising:
if the read retry limit is reached:
performing further data recovery on the set of LLR values.

15. The method of claim 14, wherein the further data recovery is at least one of: digital signal processing (DSP) and redundant array of independent disks (RAID) data recovery.

16. A non-transitory machine-readable storage medium, having encoded thereon program code, wherein, when the program code is executed by a machine, the machine implements a method of reading, by a controller, data from at least one of a storage media and a communication channel, the method comprising:
determining a value for each bit of a shortened codeword of the read data, wherein the shortened codeword comprises a plurality of non-shortened bits of a full codeword, the full codeword comprising the plurality of non-shortened bits and one or more shortened bits, the shortened bits corresponding to bits unused in the shortened codeword;
converting the determined values for each bit of the shortened codeword into a first set of log-likelihood ratio (LLR) values;
decoding the full codeword using the first set of LLR values for the shortened codeword;
dampening one or more LLR values of the first set of LLR values, the one or more LLR values corresponding to non-shortened bits of the codeword to produce a second set of LLR values, wherein the dampening comprises:
setting one or more LLR values corresponding to shortened bits of the shortened codeword to an associated maximum LLR magnitude; and
decoding the second set of LLR values,
wherein the step of dampening one or more LLR values is performed only if the decoding of the first set of LLR values did not successfully recover data corresponding to the shortened codeword.

17. A controller coupled to a host device and at least one of a storage media and a communication channel, the controller comprising:
a buffer configured to store data read from the at least one of a storage media and a communication channel;
a low density parity check decoder configured to:
determine a value for each bit of a shortened codeword of the read data, wherein the shortened codeword comprises a plurality of non-shortened bits of a full codeword, the full codeword comprising the plurality of non-shortened bits and one or more shortened bits, the shortened bits corresponding to bits unused in the shortened codeword;
convert the determined values for each bit of the shortened codeword into a first set of log-likelihood ratio (LLR) values;
decode the full codeword using the first set of LLR values for the shortened codeword;
dampen one or more LLR values of the first set of LLR values, the one or more LLR values corresponding to non-shortened bits of the codeword to produce a second set of LLR values, wherein the decoder is configured to dampen by:
setting one or more LLR values corresponding to shortened bits of the shortened codeword to an associated maximum LLR magnitude; and
decode the second set of LLR values,
wherein the step of dampening one or more LLR values is performed only if the decoding of the first set of LLR values did not successfully recover data corresponding to the shortened codeword.

18. The controller of claim 17, wherein:
the controller is configured to dampen the one or more LLR values only if the decoding of the first set of LLR values did not successfully recover data corresponding to the shortened codeword, wherein the one or more LLR values are dampened by setting one or more LLR values corresponding to shortened bits of the shortened codeword to an associated maximum LLR magnitude;

the storage media comprises at least one of: a solid-state disk (SSD), a hard disk drive (HDD), an optical storage system, and a hybrid solid-state and magnetic storage system;

the communication channel comprises at least one of: a backplane, a drive head in a magnetic recording system, one or more optical fibers, one or more coaxial cables, one or more twisted pair copper wires, and one or more radio frequency (RF) channels; and the controller is implemented as a system-on-chip (SoC).

* * * * *